United States Patent [19]
Gross

[11] Patent Number: 5,825,228
[45] Date of Patent: Oct. 20, 1998

[54] LOW QUIESCENT POWER, HIGH OUTPUT POWER RAIL-TO RAIL AMPLIFIER OUTPUT STAGES AND METHODS FOR USING SAME

[75] Inventor: William H. Gross, Sunnyvale, Calif.

[73] Assignee: Linear Technology Corp., Milpitas, Calif.

[21] Appl. No.: 592,976

[22] Filed: Jan. 29, 1996

[51] Int. Cl.$^6$ .............................. H03K 17/60; H03F 3/26
[52] U.S. Cl. ..................... 327/333; 327/561; 327/112; 327/319; 330/255; 330/263; 330/267; 326/89
[58] Field of Search .................................... 327/560, 561, 327/333, 108, 112, 318, 319, 327; 326/62, 82, 89; 330/263, 255, 267, 273, 262

[56] References Cited

U.S. PATENT DOCUMENTS

| | | | |
|---|---|---|---|
| 4,216,437 | 8/1980 | Sakaida | 330/263 |
| 4,268,796 | 5/1981 | Palara | 330/267 |
| 4,570,128 | 2/1986 | Monticelli | 330/267 |
| 4,688,001 | 8/1987 | Dijkmans et al. | 330/297 |
| 4,800,339 | 1/1989 | Tanimoto et al. | 330/255 |
| 4,864,249 | 9/1989 | Reiffin | 330/310 |
| 5,315,264 | 5/1994 | Sundby et al. | 330/255 |
| 5,334,950 | 8/1994 | Arimoto | 330/264 |
| 5,552,741 | 9/1996 | Kolluri | 327/560 |

OTHER PUBLICATIONS

Jett W. & Gold S., "The LT1366 Family: Precision, Rail–to–Rail Bipolar Amplifiers," *Linear Technology Magazine*, published by Linear Technology Corporation, vol. IV, No. 3, pp. 13–16 (Oct. 1994).

Close J.P., "A JFET Input Single Supply Operational Amplifier with Rail–to–Rail Output," IEEE 1993 Bipolar Circuits and Technology Meeting 9.2, pp. 149–152 (1993).

Vyne R.L. et al., "A Quad Low Voltage Rail–to–Rail Operational Amplifier," IEEE 1992 Bipolar Circuits and Technology Meeting 12.3, pp. 242–245 (1992).

Fonderie J. & Huijsing J.H., "Operational Amplifier with 1–V Rail–to–Rail Multipath–Driven Output Stage," IEEE Journal of Solid State Circuits, vol. 26, No. 12, pp. 1817–1824 (Dec. 1991).

Huijsing J.H. & Linebarger D., "Low–Voltage Operational Amplifier with Rail–to–Rail Input and Output Ranges," IEEE Journal of Solid State Circuits, vol. SC–20, No. 6, pp. 1144–1150 (Dec. 1985).

"Rail–to–Rail High Output Current Operational Amplifier— OP279," Analog Devices, Inc., Norwood, Massachusetts (1995).

"Precision Rail–to–Rail Input & Output Operational Amplifier—OP284/OP484," Analog Devices, Inc., Norwood, Massachusetts (1995).

"160 MHz Rail–to–Rail Amplifier with Disable—AD8041," Analog Devices, Inc., Norwood, Massachusetts (1995).

*Primary Examiner*—Timothy P. Callahan
*Assistant Examiner*—Terry L. Englund
*Attorney, Agent, or Firm*—Fish & Neave; Robert W. Morris

[57] ABSTRACT

Low quiescent power, high output power, rail-to-rail output stage circuits and methods are provided. The output stages are capable of providing output voltages that are substantially equal to the supply voltages (i.e., within one $V_{CE\_SAT}$ of both supply voltages) without a substantial increase in output circuit complexity and without a substantial increase in quiescent current. The output stages operate by providing a direct path for the drive signal to the output sinking transistor, and an additional, separate path for the drive signal to the output sourcing transistor. The sinking and sourcing paths are separated by a PNP transistor that gradually turns off during sinking to isolate that portion of the circuit so that the drive current to the sinking transistor is not reduced. Additional embodiments are provided where additional components are utilized to further increase the maximum sink and source currents without a significant increase in quiescent current or reduction in output swing.

13 Claims, 5 Drawing Sheets

LOW QUIESCENT POWER, HIGH OUTPUT POWER RAIL-TO RAIL AMPLIFIER OUTPUT STAGES AND METHODS FOR USING SAME

BACKGROUND OF THE INVENTION

This invention relates to output stages of operational amplifier circuits, and other circuits which incorporate the output stages typically utilized in operational amplifier circuits. More particularly, the present invention relates to output stages that consume low quiescent power while providing high output power that substantially extends from rail-to-rail. The present invention also relates to output stages that provide a large voltage gain.

The output stage provides impedance isolation so that the gain characteristics of the input and intermediate stages of an operational amplifier are preserved under load, while still providing adequate signal current to the load. The most common output stages are typically some form of an emitter follower stage that is adapted to the specific output stage requirements. Class A emitter follower stages, however, often require a large quiescent current when the output stage must be capable of providing supply current of either polarity (which is a typically desired characteristic of operational amplifiers).

One very popular choice for a dual polarity output stage is the class AB complementary emitter follower stage. An AB emitter follower stage may be configured to provide relatively high output current and relatively low quiescent current without the crossover distortion of class B emitter followers (another emitter follower stage that provides dual polarity outputs). For example, in AB emitter follower stages, the quiescent current is controlled by the current biasing diodes, the relative voltage drops of the diodes and the output transistor emitter-base junctions, and the emitter resistors.

In the simplest known configurations, the class AB emitter follower stage output current is still relatively limited. One known method for increasing the output current is to use Darlington-connected transistors coupled to the load. This implementation, however, suffers from a relatively limited range of output swing due to the extra transistors coupled to the load (i.e., the extra $V_{BE}$ due to the additional transistor).

One of the problems in attempting to improve the performance characteristics of the AB emitter follower output stage is that, often, an improvement in one area leads to a performance degradation in another area. For example, some known output stage circuits improve the output swing such that the output is within $V_{CE\ SAT}$ of either supply (i.e., the positive or the negative supply). Additionally, these implementations tend to be more complex and expensive because several additional transistors are often required to achieve the desired output swing.

In view of the foregoing, it would be desirable to provide output stage circuits that provide an output swing that is substantially equal to the supply voltages.

It would also be desirable to provide output stage circuits that provide an output swing that is substantially equal to the supply voltages while providing a large voltage gain.

It would be further desirable to provide output stage circuits that are relatively simple to implement while providing a large output drive current.

It would be still further desirable to provide output stage circuits that provide a relatively large output current with a relatively small quiescent current.

It would be even still further desirable to provide output stage circuits that provide a very large voltage gain when sourcing current.

SUMMARY OF THE INVENTION

It is therefore an object of the invention to provide output stage circuits that provide an output swing that is substantially equal to the supply voltages.

It is another object of the invention to provide an output swing that is substantially equal to the supply voltages while providing a large voltage gain.

It is a further object of this invention to provide output stage circuits that are relatively simple to implement while providing a large output drive current.

It is still a further object of this invention to provide a relatively large output current with a relatively small quiescent current.

It is yet a further object of this invention to provide output stage circuits that provide a very large voltage gain when sourcing current.

In accordance with these and other objects of the invention, wide-swinging output stage circuits that have low quiescent current, high voltage gain, and large output current, and methods employing those output stages are provided. In particular, the output stages of the present invention are capable of providing output voltages that are substantially equal to the supply voltages (i.e., within one $V_{CE\ SAT}$ of both supply voltages). Further, the wide-swinging output is provided without a substantial increase in circuit complexity and without a substantial increase in quiescent current.

The output stages of the present invention provide a direct path for the input signal to drive the output sinking transistor, while providing an additional, separate path for the input signal to drive the output sourcing transistor. The separate path for the output sourcing transistor includes a transistor that increases the current gain of the output stage while level shifting the drive to the output transistor. The paths between the sinking and sourcing transistors are separated by a PNP transistor that gracefully turns off during current sinking to isolate the current sinking portion of the circuit so that the drive current to the sinking transistor is not reduced. Additional embodiments are provided in which additional components are utilized to further increase the maximum sink and source currents without any significant increase in quiescent current or reduction in output swing.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Amplifier output stage circuits incorporating the principles of the present invention are described below. The amplifier output stage circuits provide output voltages that swing substantially from rail-to-rail at high output currents without incurring large quiescent currents. Furthermore, the circuits and methods of present invention provide the large output current with low quiescent current without requiring the large numbers of transistors and overall complexity previously found in the art.

Figure 1:
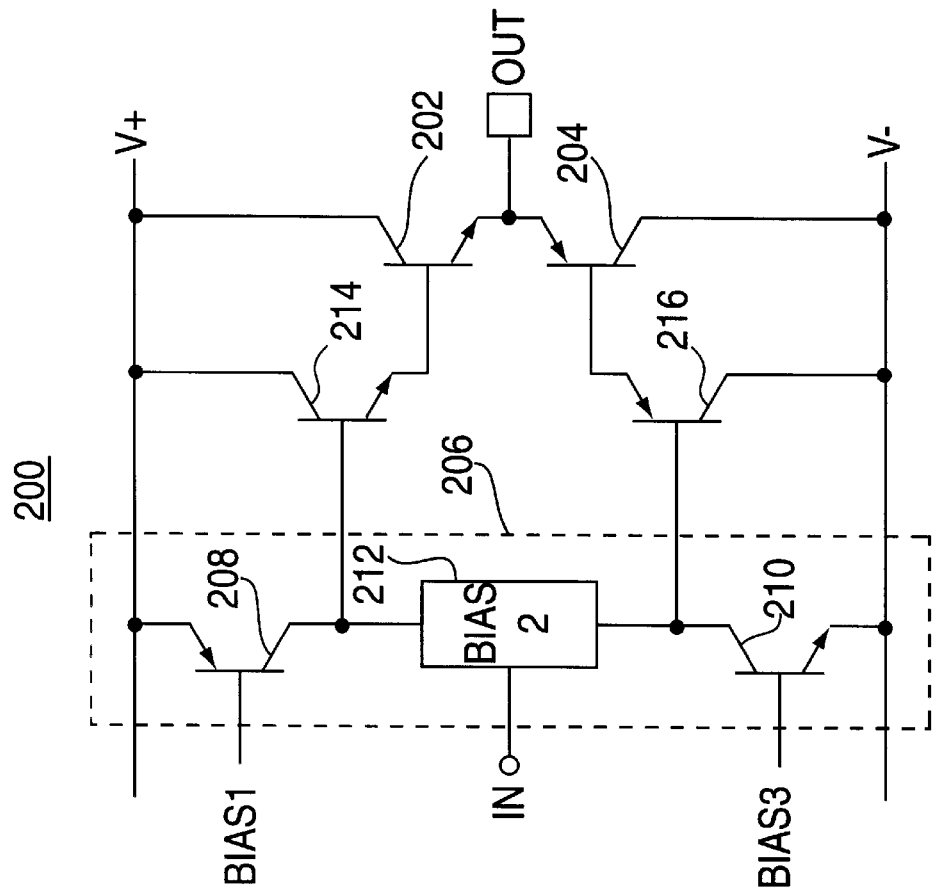
FIG. 1 is a schematic block diagram of a known class AB complementary emitter follower output stage circuit.

FIG. 1 illustrates a known simplified amplifier output stage circuit 100. Output stage 100 includes sourcing NPN transistor 102 and sinking PNP transistor 104 coupled in series in an emitter follower configuration between positive voltage supply V+ and negative voltage supply V−. An output node of output stage 100 is formed at a node between the emitters of transistors 102 and 104. Additionally, a bias circuit 106 is coupled to the bases of transistors 102 and 104 such that the emitter follower is biased as a class AB stage.

Bias circuit 106 includes bias PNP transistor 108 and bias NPN transistor 110 coupled in series. A bias circuit 112 is coupled to the collectors of transistors 108 and 110 such that the base of sourcing transistor 102 is coupled to the collector of transistor 108, and the base of sinking transistor 104 is coupled to the collector of transistor 110. Bias circuit 106 is configured so that a current $I_1$ passes from sourcing supply V+, through transistor 108, bias circuit 112 and transistor 110 to sinking supply V−. Therefore, the quiescent current of output stage 100 is approximately $I_1$, while the maximum output current is approximately beta+1 times $I_1$. Additionally, the output swing of output stage 100 is approximately within $V_{BE}+V_{CE\_SAT}$ of either supply (i.e., within approximately 1 volt of either supply voltage).

Figure 2:
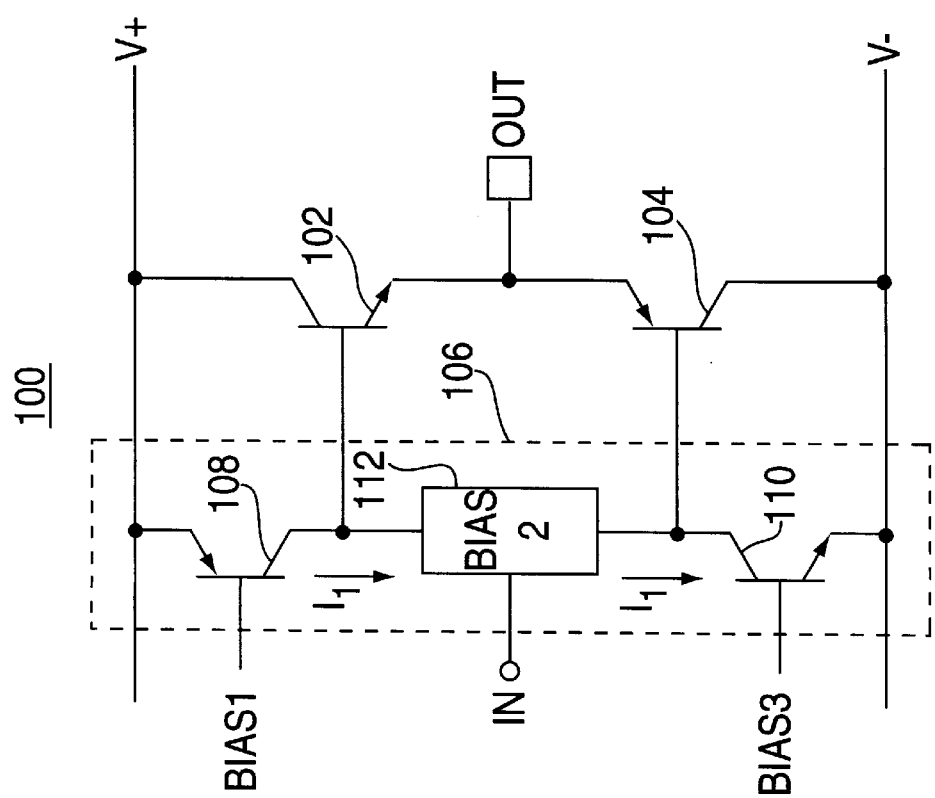
FIG. 2 is a schematic block diagram of another known class AB complementary emitter follower output stage circuit, in which the sinking and sourcing transistors are Darlington connected.

FIG. 2 illustrates an improvement to the output stage 100 of FIG. 1 in output stage 200. Output stage 200 improves upon output stage 100 by providing increased output current through the use of Darlington connected transistors. A large number of the components of output stage 200 are substantially identical to the components described above for FIG. 1, and therefore, for simplicity, are referenced with numerals having the same last two digits (e.g., bias circuits 106 and 206 are substantially identical). Therefore, only the circuit elements that vary from FIG. 1 are discussed below.

The primary difference between the output stages of FIGS. 1 and 2, is that output stage 200 includes two additional transistors 214 and 216. Darlington connected transistor 214 has its base coupled to receive the drive signal from the node between bias transistor 208 and bias circuit 212, and its emitter coupled to the base of sourcing transistor 202 to supply the drive signal to the output. Darlington transistor 216 has its base coupled to receive the drive signal from the node between bias transistor 210 and bias circuit 212, and its emitter coupled to the base of sinking transistor 204 to supply the drive signal to the output. The Darlington connected output transistors increase the output current to be I1 times (beta+1)$^2$. Unfortunately, the additional transistors also reduce the range that output stage 200 can swing, to within $2V_{BE}+V_{CE\_SAT}$ of either supply voltage (i.e., to approximately within 1.7 volts of either supply voltage).

Figure 3:
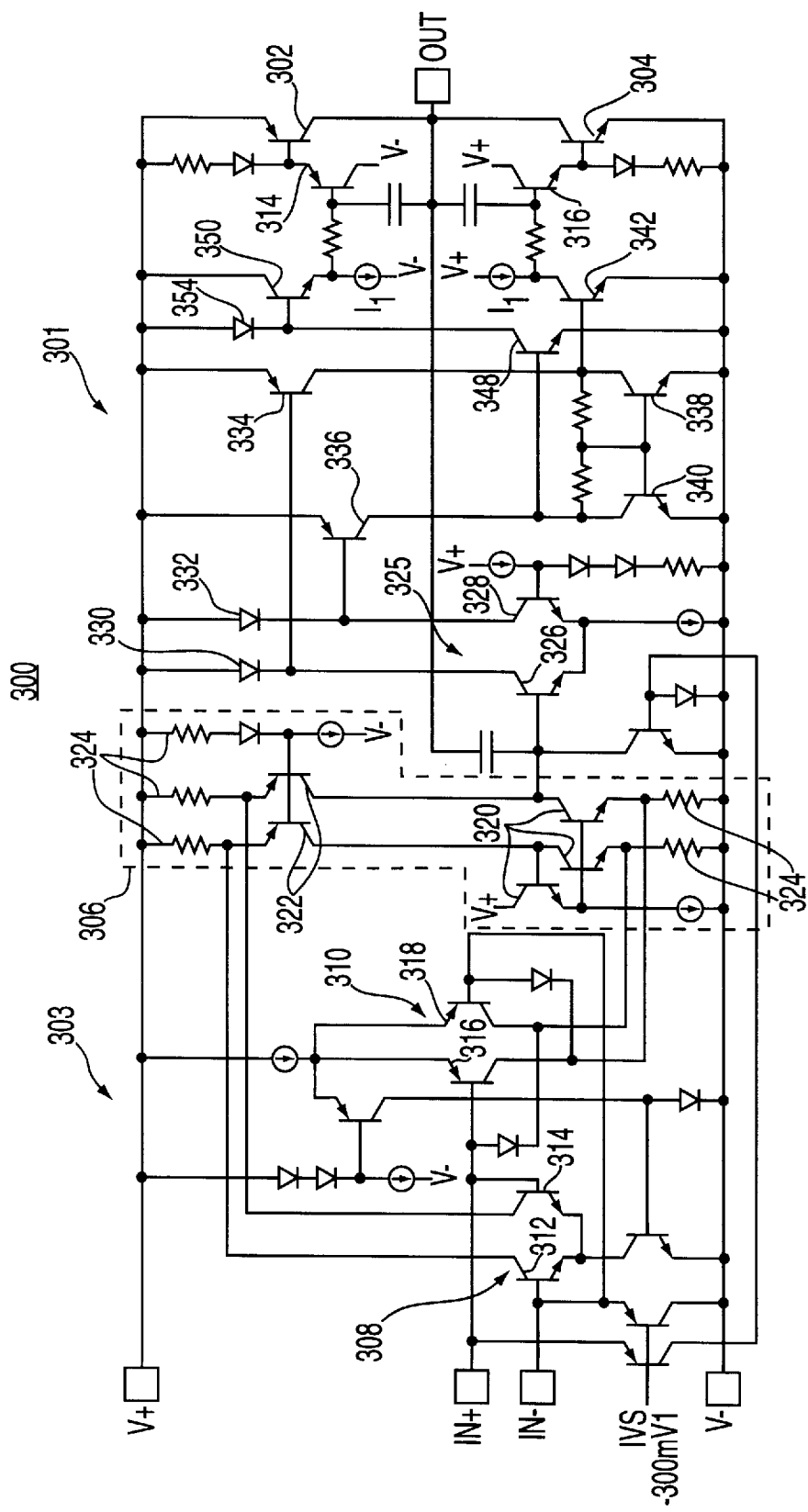
FIG. 3 is a schematic block diagram of another known class AB output stage circuit, in which the output swing is substantially equal to the supply voltages.

Another improvement on the traditional class AB emitter follower output stage is provided in output stage 301 of amplifier 300 shown in FIG. 3. Amplifier 300 is a simplified schematic of the LT1366: Dual And Quad Precision Rail-To-Rail Input And Output OpAmps, available from Linear Technology Corporation, Milpitas, Calif. Output stage 301 provides substantially the same improvement in output current over output stage 100 as the circuit shown in FIG. 2 (i.e., output current is approximately equal to I1 times (beta+1)$^2$), but also provides an improvement in output swing. Amplifier 300 also includes input stage 303, which provides the input drive signal to output stage 301 through a differential to single-ended converter circuit 306.

Amplifier 300 receives a pair of differential inputs IN+ and IN−, that are fed to a pair of differential amplifiers 308 and 310. Differential amplifier 308 is formed from NPN transistors 312 and 314, while amplifier 310 is formed from PNP transistors 316 and 318. The differential amplifiers 308 and 310 produce output signals that are passed to differential to single-ended converter circuit 306. Circuit 306 receives the output signal from the appropriate differential amplifier and provides a single output signal to output stage 301. Differential to single-ended converter circuit 306 is formed from NPN transistors 320, PNP transistors 322 and resistors 324.

The driving signal for output stage 301 is provided to the base of transistor 326 in output stage 301 as one input to differential amplifier 325 (differential amplifier 325 is formed from NPN transistors 326 and 328). Amplifier 325 generates two out of phase currents in diodes 330 and 332 that are mirrored by PNP transistors 334 and 336. The mirrored currents are mirrored into active load transistors 338 and 340 to generate two out of phase voltages. The voltage at the collector of transistor 338 drives the sinking current side, which primarily includes transistors 316 and 342, and sinking output transistor 304. The voltage at the collector of transistor 340, on the other hand, drives the sourcing current side, which primarily includes transistors 314, 348, and 350, diode 354, and sourcing output transistor 302.

The maximum output current of output stage 301 is much higher than the quiescent current because the drive is increased by the current gain of Darlington connected transistors (i.e., NPN transistors 304 and 316 on the sinking side and PNP transistors 302 and 314 on the sourcing side). Additionally, the output voltage of output stage 301 is capable of swinging to within a $V_{CE\_SAT}$ of each supply voltage. Unfortunately, while the output current is significantly higher than the quiescent current, the additional current caused by differential amplifier 325 and the level shift circuit increases the quiescent current to a level that may be undesirable. Further, output stage 301 is relatively complex, requiring several additional transistors to provide the increased output current.

Figure 4:
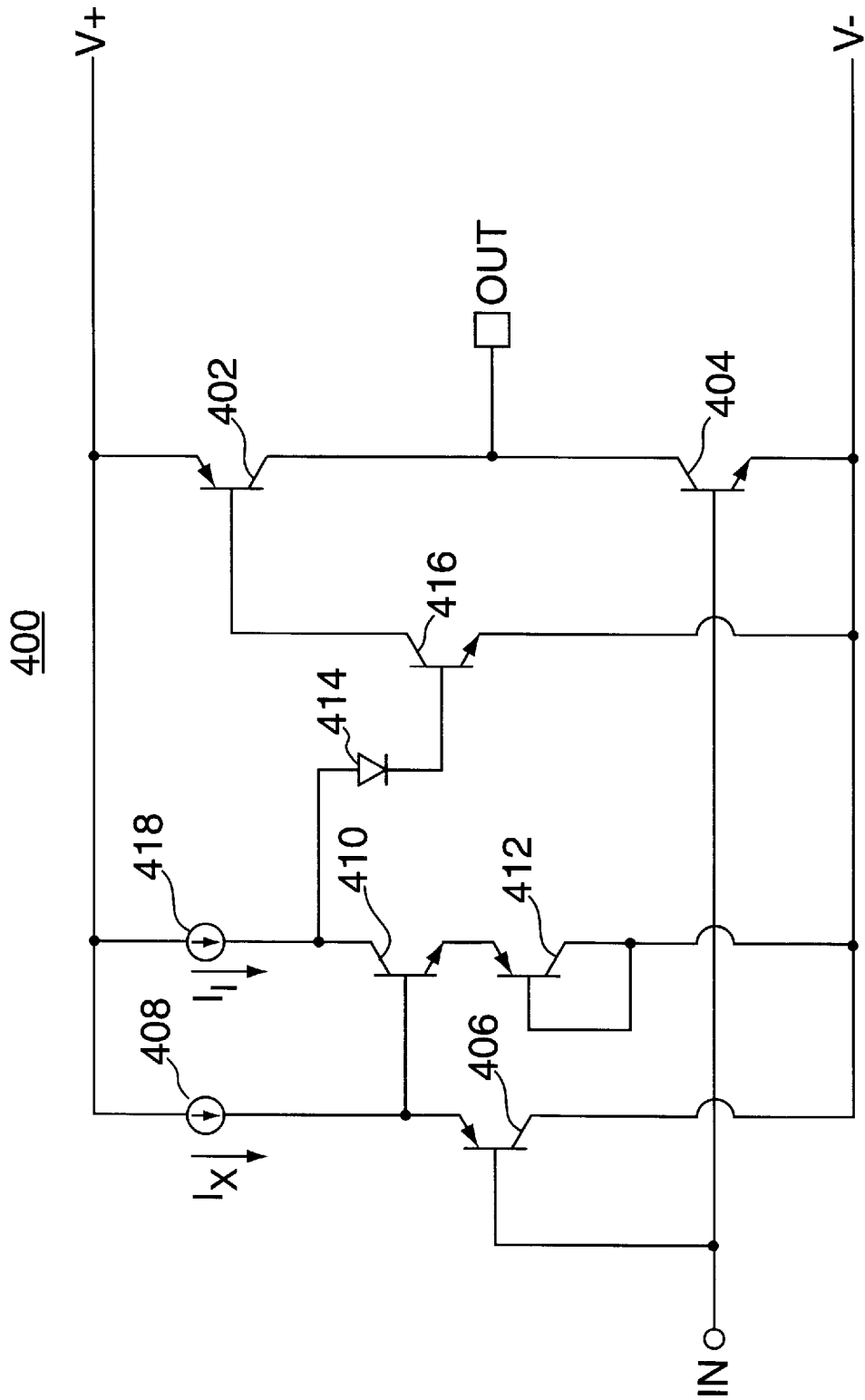
FIG. 4 is a schematic diagram of one embodiment of an output stage circuit in accordance with the principles of the present invention, employing a transistor to isolate the sinking and sourcing portions of the circuit.

The disadvantages of the previously described output stages are overcome, in accordance with the principles of the present invention, by output stage 400 shown in FIG. 4. Output stage 400 provides an output voltage that swings to be substantially equal to either voltage supply (i.e., within $V_{CE\_SAT}$ of each supply), while supplying a relatively high output current. In contrast to previously described output stages, output stage 400 is implemented with fewer transistors (i.e., less complex), and thus, has a relatively small quiescent current. Additionally, output stage 400 provides a very large voltage gain when sourcing current so that it may also be operated as a single supply amplifier.

Output stage 400 includes sourcing PNP transistor 402 and sinking NPN transistor 404 coupled in series between sourcing supply V+ and sinking supply V−. The output node OUT is coupled to a node between the collectors of transistors 402 and 404. In one aspect of the present invention, the input drive IN is coupled directly to the base of sinking transistor 404. At the same time, input drive IN is also coupled to the base of isolation PNP transistor 406. Isolation transistor 406 provides significant advantages during current sinking by gracefully turning off to prevent any current from being drawn away from sinking transistor 404. As the output stage attempts to sink more current, isolation transistor 406 merely shuts off even harder, thus preventing any of the drive signal from being wastefully drawn away. Contrary to output stage 400, each of the previously described circuits requires significantly more circuitry, such as differential amplifiers, before both the sourcing and sinking circuity to provide increased output current.

In the configuration shown in FIG. 4, output stage can sink a maximum output current that is approximately equal to beta of transistor 404 times whatever drive current is supplied at IN (because the drive signal is directly coupled to the base of transistor 404 and the fact that transistor 406 is in cutoff mode when transistor 404 is conducting, which isolates the remaining circuitry from the drive signal during sinking). Further, the output current during sourcing is approximately the same as described above for output stages 200 and 301.

Output stage 400 provides one path for sourcing current and a separate path for sinking current (the sinking current path, as described above, is simply sinking transistor 404). The sourcing path includes isolation transistor 406 in an emitter follower configuration (receiving current from current source 408) coupled to NPN transistor 410. NPN transistor 410 is configured as a common emitter amplifier that inverts the drive signal received from transistor 406. PNP transistor 412 and diode 414 provide biasing for sourcing transistor 402, in a manner similar to biasing circuits 106 and 206 of FIGS. 1 and 2. The inverted signal is passed to NPN transistor 416 which increases the current gain while level shifting the drive signal to sourcing transistor 402. In this manner, the maximum output sourcing current is I1 times the beta of transistor 402 times the beta of transistor 416 (i.e., basically, $I_1$ times beta$^2$).

The quiescent current that flows in sourcing and sinking transistors 402 and 404 is essentially set by the current in current sources 408 and 418, the area ratio between PNP transistors 406 and 412, and the area ratio between NPN transistors 404 and 410. Thus, output stage 400 provides a relatively high output current and an output voltage that swings to be substantially equal to either supply without increasing quiescent current to unacceptable levels.

Figure 5:
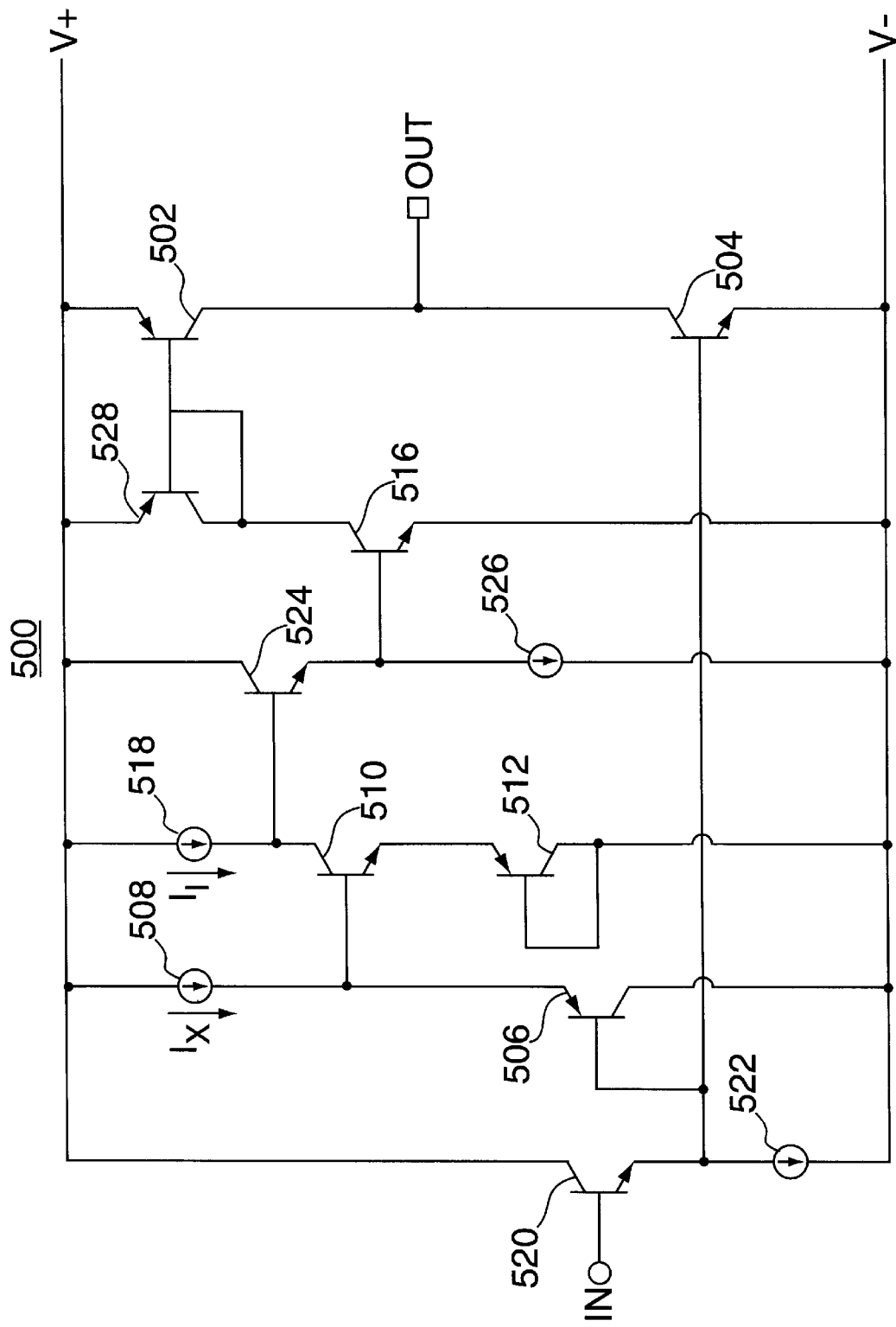
FIG. 5 is a schematic diagram of another embodiment of an output stage circuit in accordance with the principles of the present invention, in which the maximum sink and source currents are increased.

A further improvement in accordance with the principles of the present invention is shown in output stage 500 of FIG. 5. Output stage 500 provides substantially all of the advantages of output stage 400 while also providing further increased gains in sinking current and sourcing current. Components in FIG. 5 that provide substantially the same function as components of FIG. 4 are numbered using the same last two digits as in FIG. 4, and thus, the description above applies equally to those components. For example, the sourcing and sinking is provided to output node OUT through transistors 402 and 404 in FIG. 4 and through transistors 502 and 504 in FIG. 5.

Output stage 500 varies from output stage 400 in that additional transistors are provided to increase the current sinking gain capabilities of the circuit. Instead of directly coupling IN to the base of sinking transistor 504, output stage 500 includes emitter follower NPN transistor 520 that buffers the input to increase the sinking current gain. Transistor 520 is biased by current source 522. NPN transistor 524 replaces diode 414 of output stage 400 to provide increased current and voltage gain in the sourcing path. Transistor 524 is biased by current source 526. Additionally, diode-connected PNP transistor 528 is provided to set the quiescent current in transistor 516 at a high enough level so that stability is maintained. In preferred embodiments, the area ratios of the transistors shown in FIG. 5 should be as follows:

| | |
|---|---|
| transistor 502 | 20X |
| transistor 504 | 15X |
| transistor 506 | 1X |
| transistor 510 | 2X |
| transistor 512 | 2X |
| transistor 516 | 1X |
| transistor 520 | 1X |
| transistor 524 | 1X |
| transistor 528 | 2X |

Assuming that currents $I_X$ and $I_1$ are both about 3 microamps, the biasing equation of the currents in sourcing and sinking transistors 502 and 504 is as follows:

$$V_T \ln \frac{I_1}{I_{S510}} + V_T \ln \frac{I_1}{I_{S512}} = V_T \ln \frac{I_X}{I_{S506}} + V_T \ln \frac{I_{C504}}{I_{S504}}$$

This equation may be simplified by removing all of the $V_T \ln$ terms which results in:

$$\frac{I_1}{I_{S510}} * \frac{I_1}{I_{S512}} = \frac{I_X}{I_{S506}} * \frac{I_{C504}}{I_{S504}}$$

Thus, solving for $I_{C504}$ results in a quiescent current of:

$$I_{504} = I_1 * \frac{I_1}{I_X} * \frac{I_{S504}}{I_{S510}} * \frac{I_{S506}}{I_{S512}} = 3\mu a * \frac{3\mu a}{3\mu a} * \frac{15}{2} * \frac{1}{2} = 11.25 \mu a$$

It should be noted that, in accordance with the principles of the present invention, this biasing is independent of NPN to PNP matching which is not as well controlled as matching of like transistors.

Figure 6:
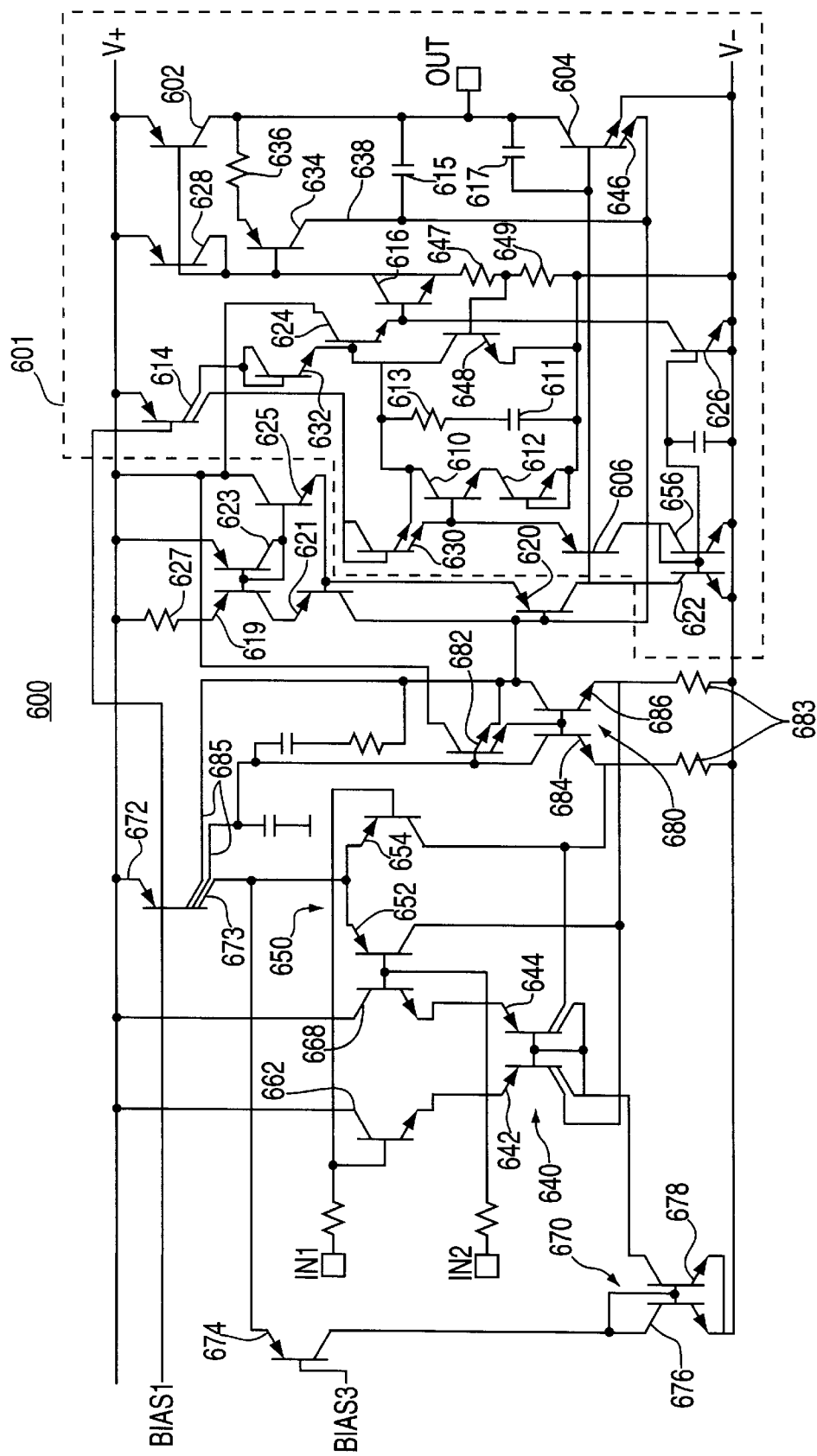
FIG. 6 is a schematic diagram of a preferred embodiment of an output stage circuit and method constructed in accordance with the principles of the present invention, employing a transistor to isolate the sinking and sourcing portions of the circuit.

The preferred embodiment of the present invention is shown in amplifier output stage 600 of FIG. 6. Amplifier output stage 600 specifically includes output stage 601 that is an improved version of output stage circuit 500 shown in FIG. 5, as well as additional amplifier circuitry that is similar to input stage 303 described above. The additional amplifier circuitry receives a pair of differential inputs IN1 and IN2 that are fed into a pair of differential amplifiers 640 and 650. Differential amplifier 640 is formed from two-collector PNP transistors 642 and 644, and non transistors 662 an 668. Differential amplifier 650 is formed from PNP transistors 652 and 654. Bias current is provided to differential amplifiers 640 and 650 from the collector 673 of transistor 672.

Transistor 674 conducts the current from collector 673 when the input voltage is greater than the bias 3 voltage applied to the base of transistor 674. As 674 conducts, it removes the current from differential amplifier 650, effectively turning 650 off. The collector current of 674 is the input to current mirror 670 consisting of transistors 676 and 678. The output of current mirror 670 feeds differential amplifier 640 thereby turning it on. The output signal from the differential amplifiers is fed to differential to single-ended converter circuit 680, which is formed from resistors 683, transistors 682, 684 and 686, and two collectors 685 of transistor 672. The input stage of amplifier circuit 600 operates in substantially the same manner as input stage 303 of amplifier circuit 300 described above with respect to FIG. 3 (i.e., typically, only one of the differential amplifier circuits provides the drive signal to the differential to single-ended circuit). The resultant signal is provided as the drive signal to the base of transistor 620, just as the drive signal is provided to the base of transistor 520 in output stage 500 above.

Each of the components in output stage 601 that is substantially similar to a component in output stage 500 is numbered such that the last two digits are identical (i.e., circuit elements 602, 604, 606, 610, 612, 616, 620, 624 and 628). Additionally, the two collectors of transistor 614 provide the currents that bias the output stage (i.e., currents $I_X$ and $I_1$ of FIG. 5). Transistor 630 clamps the collector of transistor 610 to prevent transistor 610 from saturating when output stage 600 is sinking current to improve the circuit performance when transitioning from sinking to sourcing (i.e., reduced cross-over distortion). Diode-connected transistor 632 is coupled in series with current source 614 to improve the performance of output stage 601 by preventing transistor 616 from turning on hard when the supply voltage is less than the amount required by transistors 610, 612 and 630.

PNP transistor 634 and resistor 636 detect when the output of the output stage hits the positive rail voltage and sends a current back to the input stage via lead 638 to prevent excess overdrive that would otherwise occur. This function is duplicated by second emitter 646 of sinking transistor 604 that detects when the negative rail voltage has been reached. NPN transistor 648 limits the amount of current that may be sourced by the sourcing portion of output stage 601 (the limit is set by resistors 647 and 649). Diode-connected NPN transistor 656 establishes the values for the current sources formed by NPN transistors 622 and 626. Current sources 622 and 626 provide current to transistors 620 and 624, respectively, such that they remain fast enough for the circuit to remain stable during normal operations.

Capacitor 611 and resistor 613 are coupled in series across transistors 610 and 612 to improve overall amplifier stability by lowering high frequency impedance which causes the sourcing path to operate fast enough for the amplifier to remain stable. Additionally, output stage 601 operates as a Miller integrator by way of feedback capacitor 615 that is coupled to the base of transistor 620. As is well known, Miller integrators provide an excellent way to compensate the overall amplifier. The use of feedback capacitor 615, however, may introduce instability into output stage 601. Therefore, compensation capacitor 617 is provided to eliminate any potential instability due to feedback capacitor 615. Further, the current gain of transistor 620 is enhanced by transistors 619, 621, 623, 625, and resistor 627, which increase the effective beta of transistor 620.

The output stages of the present invention have been shown and described with fast NPN transistors and slow lateral PNP transistors. Persons skilled in the art will appreciate that the principles of the present invention may also be applied to the complementary bipolar process where both the NPN and PNP transistors are fast. Additionally, the output stages shown and described in FIGS. 4–6 have been configured assuming that it is desired to have the greatest gain in the sourcing portion, rather than the sinking portion. An output stage having greater gain in the sinking portion than the sourcing portion may also be implemented in accordance with the present invention by replacing each NPN transistor with a PNP transistor, and vice versa.

Persons skilled in the art will thus appreciate that the present invention can be practiced by other than the described embodiments, which are presented for purposes of illustration and not of limitation, and thus the present invention is limited only by the claims which follow.

What is claimed is:

1. An amplifier output stage comprising:

an input node that receives an input drive signal;

an output node;

a sourcing circuit coupled to a positive voltage supply, to said output node and to said input node, said sourcing circuit providing current to said output node in response to a signal representing said drive signal;

a sinking circuit coupled to a negative voltage supply, to said output node and directly connected to said input node, said sinking circuit removing current from said output node in response to said drive signal;

an isolation circuit coupled between said input node and said sourcing circuit such that substantially no drive signal goes to said sourcing circuit when said drive signal indicates that said output stage is to sink current from said output node, and such that substantially no drive signal passes through said sinking circuit when said drive signal indicates that said output stage is to source current to said output node, said isolation circuit producing said signal representing said drive signal from the drive signal when said drive signal indicates that said output stage is to source current to said output node;

said sourcing circuit comprising a sourcing output transistor coupled to said output node, said sourcing transistor having a base coupled to said input node through said isolation circuit; and said sinking circuit comprising a sinking output transistor coupled to said output node, said sinking transistor having a base directly coupled to said input node;

wherein said sourcing circuit further comprises:

an inversion circuit coupled to said isolation circuit; and a level shifting circuit coupled to said inversion circuit and to said sourcing output transistor, said level shifting circuit providing increased gain to said signal representing said drive signal.

2. The amplifier output stage of claim 1, further comprising an emitter follower circuit coupled between said inversion circuit and said level shifting circuit, said emitter follower providing increased current and voltage gain to said signal representing said drive signal.

3. An amplifier output stage comprising:

an input node that receives an input drive signal;

an output node;

a sourcing circuit coupled to a positive voltage supply, to said output node and to said input node, said sourcing circuit providing current to said output node in response to a signal representing said drive signal;

a sinking circuit coupled to a negative voltage supply, to said output node and directly connected to said input node, said sinking circuit removing current from said output node in response to said drive signal; and an isolation circuit coupled between said input node and said sourcing circuit such that substantially no drive signal goes to said sourcing circuit when said drive signal indicates that said output stage is to sink current from said output node, and such that substantially no drive signal passes through said sinking circuit when said drive signal indicates that said output stage is to source current to said output node, said isolation circuit producing said signal representing said drive signal from the drive signal when said drive signal indicates that said output stage is to source current to said output node wherein:

said sourcing circuit comprises a sourcing output transistor coupled to said output node, said sourcing transistor having a base coupled to said input node through said isolation circuit; and said sinking circuit comprises a sinking output transistor coupled to said output node, said sinking transistor having a base directly coupled to said input node wherein said isolation circuit includes a transistor having a base coupled to said input node and to said sinking output transistor wherein said sourcing output transistor includes a PNP transistor, said sinking transistor includes an NPN transistor and said isolation transistor includes a PNP transistor, said sourcing circuit further including:

an inversion circuit coupled to said isolation circuit; and a level shifting circuit coupled to said inversion circuit and to said sourcing output transistor, said level shifting circuit providing increased gain to said signal representing said drive signal, said amplifier output stage further comprising a crossover distortion protection circuit coupled between said positive voltage supply and said inversion circuit, said protection circuit preventing said inversion circuit from saturating when said output stage is sinking current.

4. An amplifier output stage comprising:

an input node that receives an input drive signal;

an output node;

a sourcing circuit coupled to a positive voltage supply, to said output node and to said input node, said sourcing circuit providing current to said output node in response to a signal representing said drive signal;

a sinking circuit coupled to a negative voltage supply, to said output node and directly connected to said input node, said sinking circuit removing current from said output node in response to said drive signal; and an isolation circuit coupled between said input node and said sourcing circuit such that substantially no drive signal goes to said sourcing circuit when said drive signal indicates that said output stage is to sink current from said output node, and such that substantially no drive signal passes through said sinking circuit when said drive signal indicates that said output stage is to source current to said output node, said isolation circuit producing said signal representing said drive signal from the drive signal when said drive signal indicates that said output stage is to source current to said output node wherein:

said sourcing circuit comprises a sourcing output transistor coupled to said output node, said sourcing transistor having a base coupled to said input node through said isolation circuit; and said sinking circuit comprises a sinking output transistor coupled to said output node, said sinking transistor having a base directly coupled to said input node wherein said isolation circuit includes a transistor having a base coupled to said input node and to said sinking output transistor wherein said sourcing output transistor includes a PNP transistor, said sinking transistor includes an NPN transistor and said isolation transistor includes a PNP transistor, said sourcing circuit further including:

an inversion circuit coupled to said isolation circuit; and a level shifting circuit coupled to said inversion circuit and to said sourcing output transistor, said level shifting circuit providing increased gain to said signal representing said drive signal, said amplifier output stage further comprising an overdrive protection circuit coupled between said level shifting circuit and said output node so that said output node is connected in parallel with said level shifting circuit, said protection circuit preventing excess overdrive when the output of said output stage is hitting a rail voltage of one of said positive and negative voltage supplies.

5. The amplifier output stage of claim 4, wherein said overdrive protection circuit comprises:

a positive rail protection circuit coupled to said sourcing circuit; and a negative rail protection circuit coupled to said sinking circuit.

6. The amplifier output stage of claim 5, wherein said positive rail protection circuit comprises:

a protection transistor having a base coupled to said inversion circuit and having one of the collector and emitter coupled to said input node; and a resistor coupled between said output node and the other one of the collector and emitter of said protection transistor.

7. The amplifier output stage of claim 5, wherein said sinking output transistor has two emitters and one of said two emitters is coupled to said input node to form said negative rail protection circuit.

8. An amplifier output stage comprising:

an input node that receives an input drive signal;

an output node;

an isolation transistor having a base coupled to said input node;

a sourcing transistor coupled to said output node, said sourcing transistor having a base coupled to said isolation transistor;

a sinking transistor coupled to said output node, said sinking transistor having a base coupled directly to said input node;

an inverting transistor coupled between said isolation transistor and said sourcing transistor, said inverting transistor inverting a signal in response to said input drive signal; and a level shifting transistor coupled between said inverting transistor and said sourcing transistor, said level shifting transistor increasing the current gain and level shifting of said inverted signal in response to said input drive signal.

9. The amplifier output stage of claim 8 further comprising:

an emitter follower transistor coupled between said inverting transistor and said level shifting transistor, said emitter follower transistor providing increased current and voltage gain to said inverted signal in response to said input drive signal.

10. A method for providing high output current and substantially rail-to-rail output signal with low quiescent current from an amplifier output stage that sources and sinks current with respect to an output node, the method comprising the steps of:

receiving an input drive signal from an input node, said input drive signal being indicative of whether said output stage sources to or sinks from said output node;

turning on a sinking transistor directly from said drive signal and turning off an isolation transistor if said drive signal indicates that said output stage is to sink current from said output node, such that substantially all of said drive signal drives said sinking transistor;

shutting off said sinking transistor directly from said drive signal and turning on said isolation transistor and a sourcing transistor if said drive signal indicates that said output stage is to source current to said output node, such that substantially all of said drive signal drives said sourcing transistor;

inverting said drive signal if said drive signal indicates that said output stage is to source current to said output node; and level shifting and increasing the gain of said drive signal after said step of inverting.

11. The method of claim 10 further comprising the step of increasing the voltage and current gain of said drive signal, said step of increasing occurring between said steps of inverting and level shifting.

12. The method of claim 10 further comprising the step of minimizing cross-over distortion when said output stage switches between sourcing and sinking modes.

13. The method of claim 10 further comprising the step of protecting said output stage from excess overdrive when the output of said output stage hits a voltage supply rail value, said excess overdrive occurring when a current value that drives said output of said output stage to hit said rail voltage is exceeded.

* * * * *

UNITED STATES PATENT AND TRADEMARK OFFICE
CERTIFICATE OF CORRECTION

PATENT NO.    : 5,825,228
DATED         : October 20, 1998
INVENTOR(S)   : William H. Gross It is certified that error appears in the above-identified patent and that said Letters Patent is hereby corrected as shown below:

Drawings,
Delete Drawing Sheet 5 of 5, and substitute therefore the Drawing Sheet, consisting of Figure 6, as shown on the attached page.

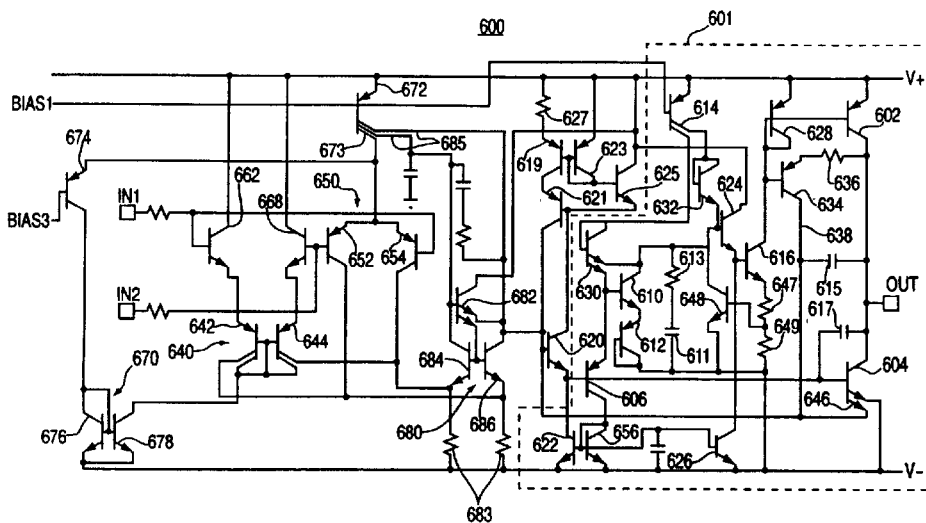

FIG. 6

Column 6,
Line 46, delete the formula and insert corrected formula:

$$I_{504} = I_1 * \frac{I_1}{I_X} * \frac{I_{S504}}{I_{S510}} * \frac{I_{S506}}{I_{S512}} = 3\mu A * \frac{3\mu A}{3\mu A} * \frac{15}{2} * \frac{1}{2} = 11.25 \mu A$$

Line 62, delete "non" and insert -- NPN --.

UNITED STATES PATENT AND TRADEMARK OFFICE
CERTIFICATE OF CORRECTION

PATENT NO.   : 5,825,228
DATED        : October 20, 1998
INVENTOR(S)  : William H. Gross It is certified that error appears in the above-identified patent and that said Letters Patent is hereby corrected as shown below:

<u>Column 6 (continued)</u>,
Line 62, delete "an" and insert -- and --.

Signed and Sealed this

Twenty-third Day of July, 2002

Attest:

Attesting Officer

JAMES E. ROGAN
*Director of the United States Patent and Trademark Office*